(12) United States Patent
Yeh et al.

(10) Patent No.: US 9,263,647 B2
(45) Date of Patent: Feb. 16, 2016

(54) LIGHT EMITTING DIODE PACKAGE STRUCTURE AND MANUFACTURING METHOD THEREOF

(71) Applicant: Everlight Electronics Co., Ltd., New Taipei (TW)

(72) Inventors: Robert Yeh, New Taipei (TW); Ke-Hao Pan, New Taipei (TW)

(73) Assignee: Everlight Electronics Co., Ltd. (TW)

( * ) Notice: Subject to any disclaimer, the term of this patent is extended or adjusted under 35 U.S.C. 154(b) by 0 days.

(21) Appl. No.: 13/913,833

(22) Filed: Jun. 10, 2013

(65) Prior Publication Data

US 2013/0334553 A1 Dec. 19, 2013

(30) Foreign Application Priority Data

Jun. 13, 2012 (TW) ............................. 101121143 A

(51) Int. Cl.
*H01L 33/50* (2010.01)

(52) U.S. Cl.
CPC .............. *H01L 33/507* (2013.01); *H01L 33/50* (2013.01); *H01L 2224/48091* (2013.01); *H01L 2933/0041* (2013.01)

(58) Field of Classification Search
CPC ..... H01L 33/507; H01L 33/50; H01L 33/501; H01L 33/502; H01L 33/504; H01L 33/505; H01L 33/508
USPC ............................................ 257/98, E33.061
See application file for complete search history.

(56) References Cited

U.S. PATENT DOCUMENTS

| | | | |
|---|---|---|---|
| 7,279,346 B2 * | 10/2007 | Andrews et al. | 438/27 |
| 7,964,885 B2 | 6/2011 | Yoo et al. | |
| 8,154,029 B2 | 4/2012 | Liao et al. | |
| 8,541,800 B2 * | 9/2013 | Joo et al. | 257/98 |
| 2009/0153022 A1 | 6/2009 | Hussell et al. | |
| 2010/0112734 A1 | 5/2010 | Koizumi et al. | |
| 2011/0303941 A1 * | 12/2011 | Lee | 257/98 |
| 2011/0309404 A1 | 12/2011 | Lee | |
| 2012/0273813 A1 * | 11/2012 | Jung | H01L 33/505 257/88 |
| 2013/0092971 A1 * | 4/2013 | Chen | 257/99 |
| 2014/0131748 A1 * | 5/2014 | Song | 257/89 |

FOREIGN PATENT DOCUMENTS

| | | | |
|---|---|---|---|
| CN | 102299231 | 12/2011 | |
| JP | 2000164937 | 6/2000 | |
| JP | 2008311477 | 12/2008 | |
| TW | 201222886 | 6/2012 | |
| WO | WO 2011160521 A1 * | 12/2011 | ............ H01L 33/505 |

* cited by examiner

*Primary Examiner* — Anthony Ho
*Assistant Examiner* — Samuel Lair
(74) *Attorney, Agent, or Firm* — Han IP Corporation

(57) ABSTRACT

Various examples of a light emitting diode (LED) package structure and a manufacturing method thereof are described. In one aspect, a LED package structure includes a carrier, a LED chip, a first annular barricade, a second annular barricade and a fluorescent encapsulant. The LED chip is electrically connected to the carrier. The first annular barricade and the second annular barricade are disposed around the LED chip, with the second annular barricade disposed between the LED chip and the first annular barricade. The fluorescent encapsulant is disposed on the carrier and at least covers the LED chip and the second annular barricade. The fluorescent encapsulant includes at least a type of phosphor and at least a type of gel with the phosphor distributed over a surface of the LED chip.

6 Claims, 11 Drawing Sheets

LIGHT EMITTING DIODE PACKAGE STRUCTURE AND MANUFACTURING METHOD THEREOF

CROSS REFERENCE TO RELATED PATENT APPLICATION

The present application claims the priority benefit of Taiwan Patent Application No. 101121143, filed 13 Jun. 2012, which is hereby incorporated by reference in its entirety.

BACKGROUND

1. Technical Field

The present disclosure relates to a package structure and manufacturing method thereof and, more particularly, to a light emitting diode (LED) package structure and manufacturing method thereof.

2. Description of Related Art

LEDs are a type of illumination component comprised of III-V semiconductor materials. In general, LEDs have advantages such as long life, compact size, high shock resistance, low heat generation and low power consumption. Therefore, LEDs have been widely used in the home and a variety of equipment indicators and light sources. In recent years, development of LEDs is moving towards multi-color and high brightness, and thus the fields of application have been extended to large outdoor billboards, traffic lights, and related fields. In the future, LEDs may even become both power-saving and eco-friendly lighting source.

For example, most of the high-power white LED packages utilize one or more blue LEDs with yellow phosphor. The reason why a white LED emits white light is because its LED chip emits blue light. When blue light transmits through yellow phosphor it is converted into yellow light, and white light is formed when the yellow light converted by yellow phosphor is mixed with blue light that is not converted to yellow light. As the blue light emitted by blue LEDs has a certain degree of directivity, intensity of the part of the emitted blue light which has a larger angle of deviation from the optical axis of the LED tends to be weaker. This tends to result in the intensity of yellow light larger than the intensity of blue light at larger angles of deviation from the optical axis of the LED. As a result, a yellow halo is formed around the edge of the illuminated area of the luminaire. Additionally, uneven distribution of yellow phosphor on LEDs in the manufacturing process of white LEDs that utilize blue LED with yellow phosphor also results in yellow halo around the white light emitted by LEDs thus manufactured. This affects the uniformity of the color of light emitted by white LEDs.

Therefore, a conventional approach is to add brightener in the phosphor powder in order to reduce the incidence of yellow halo, where the brightener may be white particles or glass particles. This approach scatters the beam of light emitted by the LED to reduce the extent of the yellow halo. However, the effect achieved by the addition of brightener is often at the expense of the overall light extraction efficiency of the LED, and tends to produce no positive effect in terms of enhancing color rendering performance of the LED.

SUMMARY

The present disclosure describes various embodiments of a LED package structure that produces better optical effects. Various embodiments of a method of manufacturing the LED package structure of the present disclosure are also described.

In one aspect, a LED package structure may include: a carrier that includes a carrying region and a peripheral region surrounding the carrying region; at least one LED chip disposed on the carrier in the carrying region and electrically coupled to the carrier; a first annular wall disposed on the carrier in the peripheral region and surrounding the at least one LED chip; a second annular wall disposed within the first annular wall and surrounding the at least one LED chip, a height of the second annular wall is lower than a height of the first annular wall; and a fluorescent encapsulant disposed on the carrier and covering at least the at least one LED chip and the second annular wall, the fluorescent encapsulant comprising at least a phosphor and a gel with the phosphor distributed over a surface of the at least one LED chip.

In one embodiment, a gap between the first annular wall and the second annular wall may define a groove, and the fluorescent encapsulant may be filled in the groove.

In one embodiment, the carrier and at least the first annular wall or the second annular wall may be integral parts of a monolithic structure.

In one embodiment, the first annular wall or the second annular wall may include a plurality of discontinuous walls.

In one embodiment, the LED package structure may further include a plurality of strip walls disposed on the carrier and connected to the second annular wall, the strip walls and the second annular wall defining a plurality of lattice-shaped grooves, the at least one LED chip disposed in the lattice-shaped grooves.

In another aspect, a LED package structure may include: a carrier; a plurality of LED chips disposed on and electrically coupled to the carrier; an annular wall disposed on the carrier and surrounding the LED chips; a plurality of strip walls disposed on the carrier and connected to the annular wall, the strip walls and the annular wall defining a plurality of lattice-shaped grooves, the LED chips disposed in the grill grooves; and a fluorescent encapsulant disposed on the carrier and filled in the lattice-shaped grooves, the fluorescent encapsulant covering at least the LED chips, the fluorescent encapsulant comprising at least a phosphor and a gel with the phosphor distributed over a surface of each of the LED chips.

In one embodiment, the strip walls may abut one another to form a plurality of sub-annular walls. The sub-annular walls may be disposed on the carrier and respectively surrounding the LED chips.

In one embodiment, a height of the annular wall and a height of the strip walls may be substantially the same.

In one embodiment, a height of the strip walls may be lower than a height of the annular wall.

In one embodiment, the carrier and the annular wall may be integral parts of a monolithic structure.

In one embodiment, the LED chips may be electrically coupled to the carrier by flip chip bonding.

In one embodiment, the LED chips may be electrically coupled to the carrier by wire bonding.

In one embodiment, a material of the carrier may include ceramic, polymer, or metal.

In one embodiment, a material of the first annular wall and a material of the second annular wall may include silicon, silicon oxide, boron nitride, rubber, organic polymer, or metal.

In one embodiment, a material of the annular wall may include silicon, silicon oxide, boron nitride, rubber, organic polymer, or metal.

In one aspect, a manufacturing method of a LED package structure may include: providing a carrier that comprises a carrying region and a peripheral region surrounding the carrying region; disposing at least a LED chip on the carrier in the carrying region, the LED chip electrically coupled to the carrier; forming a first annular wall on the carrier in the peripheral region; forming a second annular wall on the carrier in the peripheral region, the second annular wall surrounding the LED chip and disposed within the first annular wall, a height of the second annular wall lower than a height of the first annular wall; filling a fluorescent encapsulant on the carrier to cover at least the LED chip and the second annular wall, the fluorescent encapsulant comprising a mixture of at least a type of phosphor and a type of gel with the phosphor dispersed in the gel; performing a centrifugal process to precipitate the phosphor in the fluorescent encapsulant on a surface of the LED chip; and performing a baking process.

In one embodiment, a gap between the first annular wall and the second annular wall may define a groove on the carrier, and the fluorescent encapsulant may be filled in the groove.

In one embodiment, the manufacturing method may further include forming a plurality of strip walls that are disposed on the carrier to connect with the second annular wall, the strip walls and the second annular wall defining a plurality of lattice-shaped grooves on the carrier with the LED chips disposed in the lattice-shaped grooves.

In one embodiment, the carrier and the first annular wall or the second annular wall may be formed monolithically.

In one embodiment, the first annular wall or the second annular wall may be a discontinuous annular wall.

In another aspect, a manufacturing method of a LED package structure may include: providing a carrier; disposing a plurality of LED chips on the carrier, the LED chips electrically coupled to the carrier; forming an annular wall on the carrier, the annular wall surrounding the LED chips; forming a plurality of strip walls on the carrier, the strip walls connected to the annular wall to define a plurality of lattice-shaped grooves with the LED chips disposed in the lattice-shaped grooves; filling a fluorescent encapsulant in a carrying region of the carrier, the fluorescent encapsulant filling the lattice-shaped grooves and covering at least the LED chips, the fluorescent encapsulant comprising a mixture of at least a type of phosphor and a type of gel with the phosphor dispersed in the gel; performing a centrifugal process to precipitate the phosphor in the fluorescent encapsulant on a surface of the LED chips; and performing a baking process.

In one embodiment, the strip walls may abut one another to form a plurality of sub-annular walls. The sub-annular walls may be disposed on the carrier and respectively surrounding the LED chips.

In one embodiment, the filling the fluorescent encapsulant in the carrying region of the carrier may include filling the fluorescent encapsulant in the lattice-shaped grooves sequentially such that a height of an upper surface of the fluorescent encapsulant, a height of an upper surface of the annular wall, and a height of each of the strip walls are substantially the same.

In one embodiment, the filling the fluorescent encapsulant in the carrying region of the carrier may include: filling the fluorescent encapsulant in some of the lattice-shaped grooves; and performing a centrifugal process such that the fluorescent encapsulant flows to two sides to fill the lattice-shaped grooves, the fluorescent encapsulant covering an upper surface of each of the strip walls.

In one embodiment, the carrier and the annular wall or the strip walls may be formed monolithically.

In one embodiment, the annular wall may include a discontinuous annular wall.

In one embodiment, the LED chips may be electrically coupled to the carrier by flip chip bonding.

In one embodiment, the LED chips may be electrically coupled to the carrier by wire bonding.

In one embodiment, a material of the carrier may include ceramic, polymer, or metal.

In one embodiment, a material of the first annular wall and a material of the second annular wall may include silicon, silicon oxide, boron nitride, rubber, organic polymer, or metal.

In one embodiment, a material of the annular wall may include silicon, silicon oxide, boron nitride, rubber, organic polymer, or metal.

Detailed description of various embodiments is provided below with reference to the attached figures to aid better understanding and appreciation of the features and benefits of the disclosed embodiments.

DETAILED DESCRIPTION OF DISCLOSED EMBODIMENTS

Figure 1A:
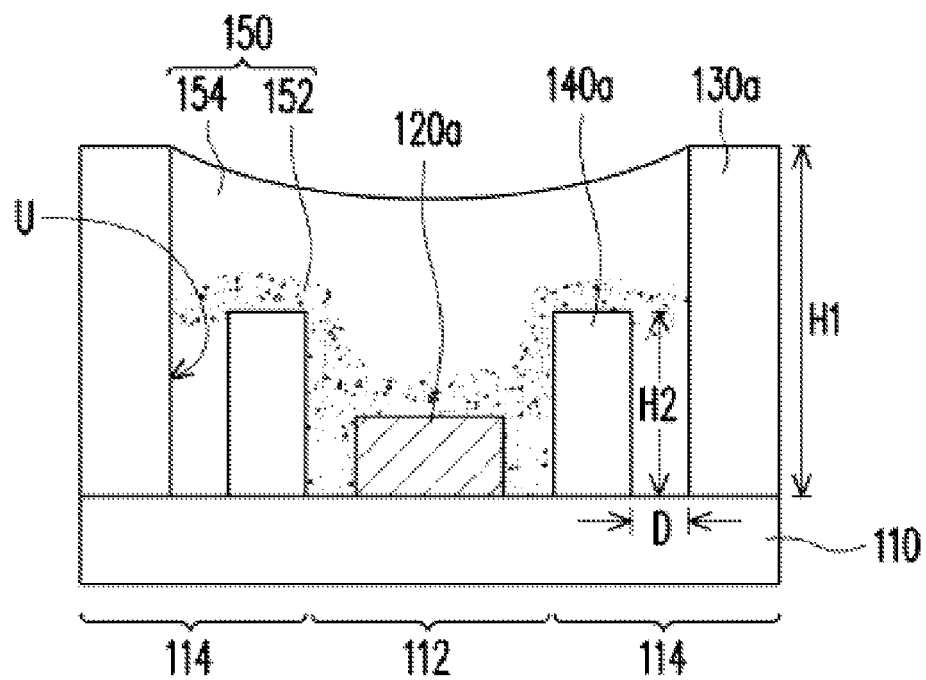
FIG. 1A is a cross-sectional view of a LED package structure in accordance with an embodiment of the present disclosure.
Figure 1B:
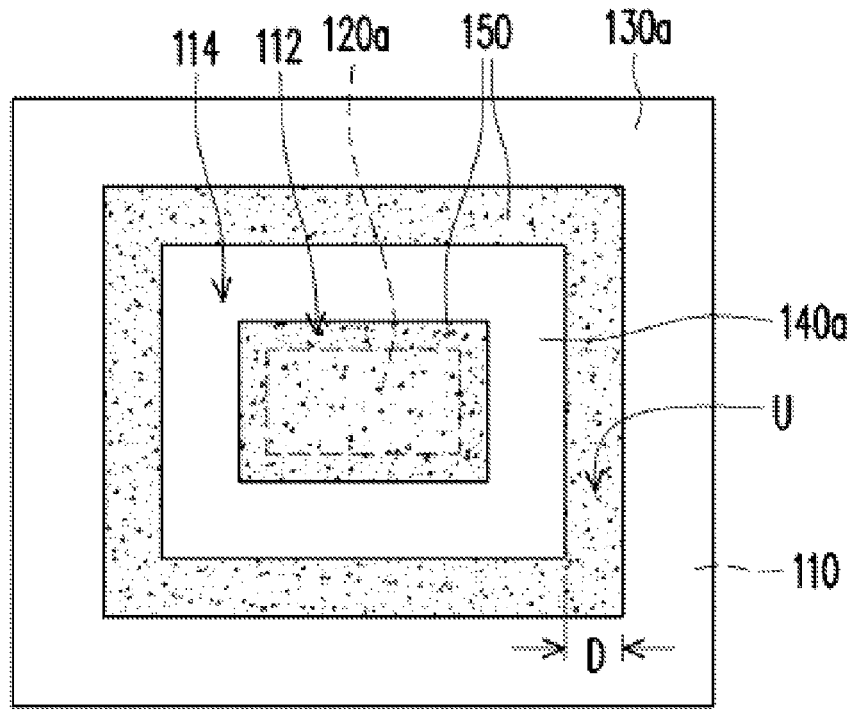
FIG. 1B is a top view of the LED package structure of FIG. 1A.
Figure 1C:
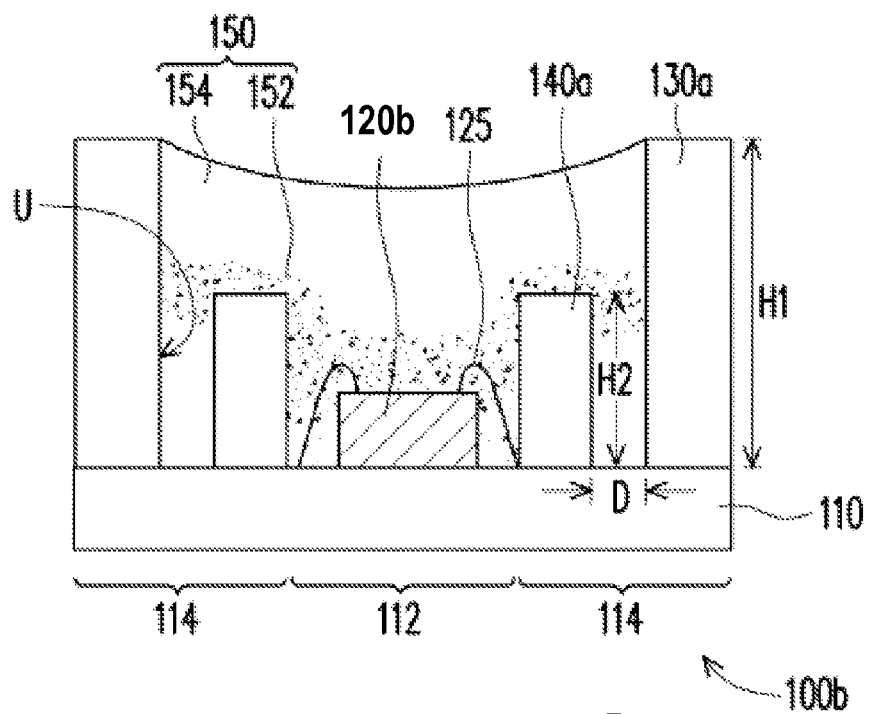
FIG. 1C is a cross-sectional view of a LED package structure in accordance with another embodiment of the present disclosure.

FIG. 1A illustrates a cross-sectional view of a LED package structure in accordance with an embodiment of the present disclosure. FIG. 1B illustrates a top view of the LED package structure of FIG. 1A. The following description refers to FIGS. 1A and 1B. In the illustrated embodiment, a LED package structure 100a includes a carrier 110, at least a LED chip 120a (a single one is shown in FIGS. 1A and 1B for illustrative purpose), a first annular wall 130a, a second annular wall 140a and a fluorescent encapsulant 150.

Specifically, carrier 110 includes a carrying region 112 and a peripheral region 114 that surrounds the carrying region 112. The material of carrier 110 may be, for example, ceramic, polymer, silicon, silicon carbide, electrically insulating material or metal. When the material of carrier 110 includes metal, carrier 110 may be a copper substrate or a metal core printed circuit board (MCPCB) but is not limited thereto.

LED chip 120a is disposed on carrier 110 in the carrying region 112, and is electrically coupled to carrier 110. In one embodiment, LED chip 120a is electrically coupled to carrier 110 by flip chip bonding technology. In other words, in one embodiment, LED package structure 100a is a surface mounted device (SMD) type of LED package structure. In one embodiment, LED chip 120a is a blue LED chip but is not limited thereto.

The first annular wall 130a is disposed on carrier 110 in the peripheral region 114 and surrounds LED chip 120a. The second annular wall 140a is disposed within the first annular wall 130a and in the peripheral region 114 of carrier 110 to surround LED chip 120a. In particular, in one embodiment, the second annular wall 140a is disposed between LED chip 120a and the first annular wall 130a, and a height H2 of the second annular wall 140a is lower than a height H1 of the first annular wall 130a. In addition, the material of the first annular wall 130a may be, for example, silicon, silicon oxide, boron nitride, rubber, an organic polymer material, or metal. The material of the first annular wall 130a may be substantially the same as or different from the material of the second annular wall 140a but is not limited thereto. Moreover, in one embodiment, the first annular wall 130a and the second annular wall 140a have the characteristics of non-absorption of light and reflectiveness. In one embodiment, each of the first annular wall 130a and the second annular wall 140a is a continuous annular wall.

Fluorescent encapsulant 150 is disposed on carrier 110 and covers at least the LED chip 120a and the second annular call 140a. More specifically, in one embodiment, fluorescent encapsulant 150 includes at least a phosphor 152 and at least a gel 154. That is, fluorescent encapsulant 150 is formed by a mixture of at least the phosphor 152 and the gel 154. Phosphor 152 is distributed over a surface of LED chip 120a. Phosphor 152 may be a yellow phosphor, red phosphor, green phosphor or any combination thereof, but is not limited thereto. Moreover, fluorescent encapsulant 150 may also include a light diffusing agent (not shown) to adjust optical effects such as color or uniformity of the light emitted by LED package structure 100a.

In the illustrated embodiment, as shown in FIG. 1A, a gap D exists between the second annular wall 140a and the first annular wall 130a and defines a groove U on carrier 110. In one embodiment, fluorescent encapsulant 150 is filled in the groove U with phosphor 152 distributed over or on a bottom surface of groove U and an upper surface of the second annular wall 140a.

In the illustrated embodiment, LED package structure 100a is designed to have the features of the first annular wall 130a and the second annular wall 140a, with phosphor 152 of fluorescent encapsulant 150 distributed over or on a surface of the LED chip 120a. Part of phosphor 152 is distributed over the bottom surface of groove U and the upper surface of the second annular wall 140a. Thus, as no excessive amount of phosphor 152 is accumulated around LED chip 120a (i.e., the peripheral region 114 of carrier 110), unused space in the peripheral region 114 of carrier 110 can be reduced to allow relatively more phosphor 152 to be distributed over the surface of LED chip 120a. Accordingly, when color light (e.g., blue light or ultraviolet light) emitted by LED chip 120a, which has a certain degree of directivity, is emitted onto phosphor 152 to excite phosphor 152 to emit different color light (e.g., yellow light or red light) to be mixed with the color light (e.g., blue light or ultraviolet light) emitted by LED chip 120a, the phenomenon of yellow halo produced by excessive phosphor 152 accumulated in the peripheral region 114 excited by LED chip 120a can be effectively avoided or otherwise minimized.

Furthermore, given that both the first annular wall 130a and the second annular wall 140a have the characteristics of non-absorption of light and reflectiveness, when color light (e.g., blue light) is emitted from LED chip 120a onto phosphor 152 that is distributed in groove U the first annular wall 130a and the second annular wall 140a can produce effects of light reflection and scattering. This causes reflected color light and diffused color light to be emitted into the carrying region 112 to effectively increase the intensity of light of LED package structure 100a. Simply put, LED package structure 100a of the present embodiment can produce better optical effects.

It is noteworthy that how LED chip 120a and carrier 110 are coupled together is not limited to any given way even though LED chip 120a is electrically coupled to carrier 10 by flip chip bonding in the illustrated embodiment. In other embodiments, referring to FIG. 10, a LED chip 120b of LED package structure 100b is electrically coupled to carrier 110 by wire bonding using multiple electrically conductive wires 125, and such is a feasible technical solution within the protective scope of the present disclosure. Moreover, although carrier 110, the first annular wall 130a and the second annular wall 140a of the illustrated embodiment are individual components, carrier 110 and the first annular wall 130a may be integral parts of a monolithic structure, or formed monolithically, in other, non-illustrated embodiments. The materials of carrier 110 and the material of the first annular wall 130a may be, for example, metal. Alternatively, carrier 110 and the second annular wall 140a may be integral parts of a monolithic structure, e.g., formed monolithically. The materials of carrier 110 and the material of the second annular wall 140a may be, for example, metal.

Figure 1D:
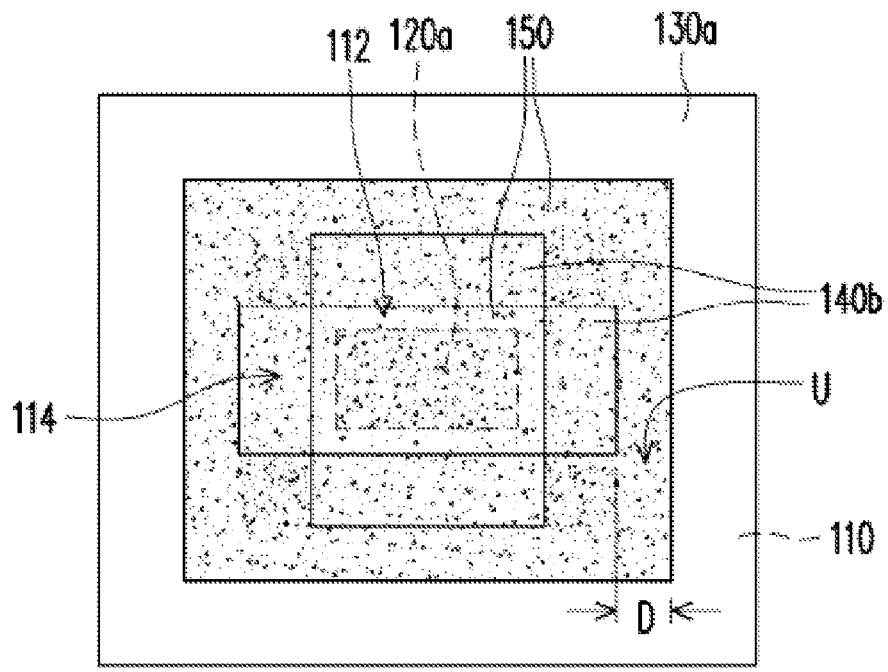
FIG. 1D is a top view of the LED package structure in accordance with an embodiment of the present disclosure.

In the illustrated embodiment, the second annular wall 140a and the first annular wall 130a have similar form in that they are continuous walls. In other embodiments, such as that shown in FIG. 1D, the second annular wall 140b of LED package structure 100c is a discontinuous wall. Under the same concept, the first annular wall 130a may also be a discontinuous wall (not shown). Such variations are feasible technical solutions with the protective scope of the present disclosure. Additionally, in other embodiments, those ordinarily skilled in the art may, depending on actual implementations, selectively use above-described components, materials for the components, forms of the components and arrangement to achieve the desired technical effect(s).

Figure 2A:
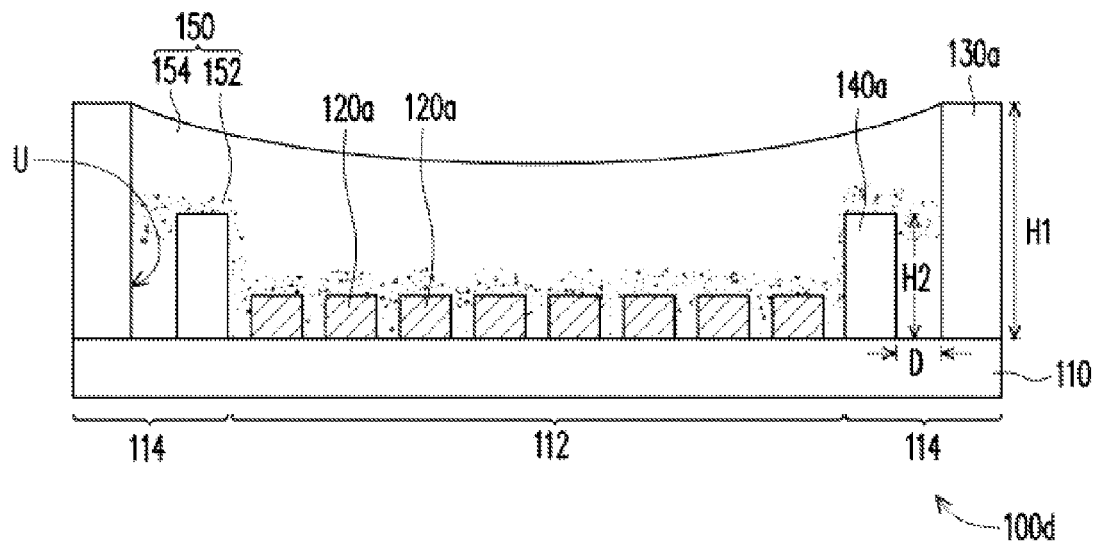
FIG. 2A is cross-sectional view of a LED package structure in accordance with yet another embodiment of the present disclosure.
Figure 2B:
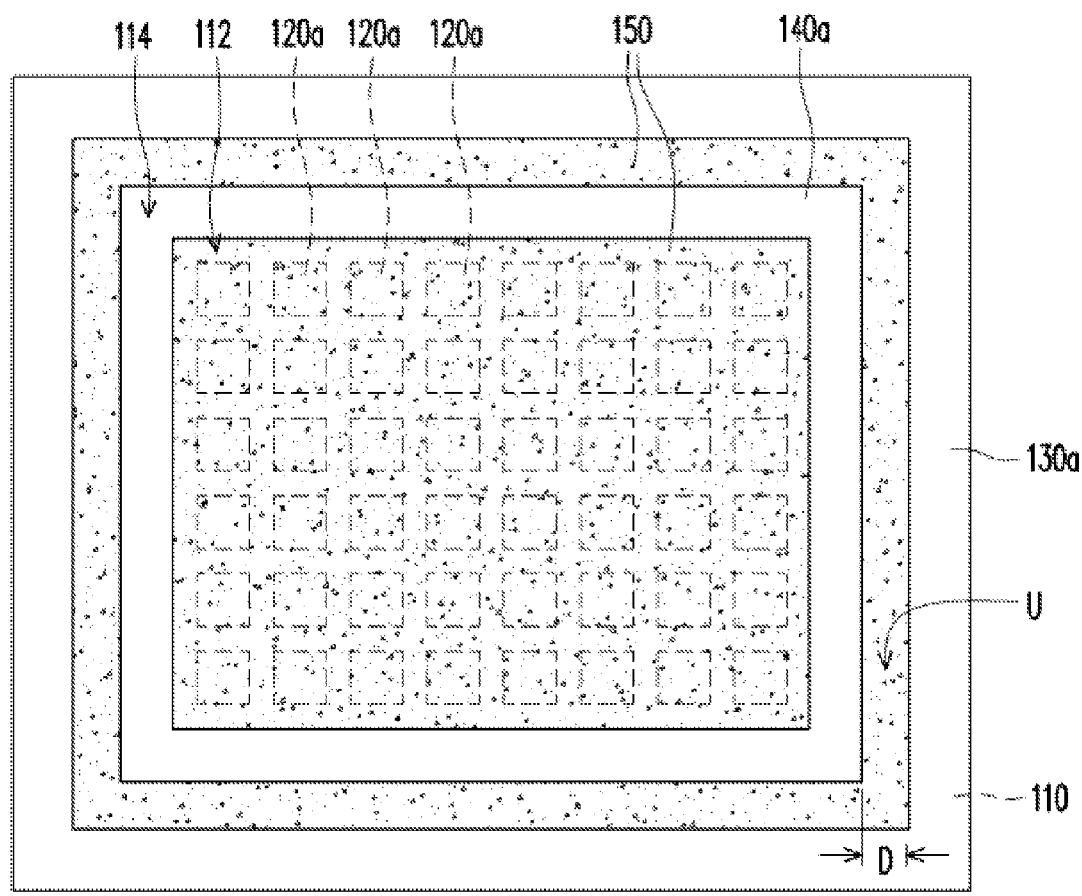
FIG. 2B is a top view of the LED package structure of FIG. 2A.

FIG. 2A illustrates a cross-sectional view of a LED package structure in accordance with another embodiment of the present disclosure. FIG. 2B illustrates a top view of the LED package structure of FIG. 2A. For certain components thereof that are similar or identical to those described above, the same numeral references are used. In the interest of brevity, detailed description of such components is not repeated.

Referring to FIGS. 2A and 2B, LED package structure 100d of FIGS. 2A and 2B is similar to LED package structure 100a of FIGS. 1A and 1B. One difference is that LED package structure 100d of FIGS. 2A and 2B includes multiple LED chips 120a, and the LED chips 120a are electrically coupled to carrier 110 by flip chip bonding. LED package structure 100d may be, for example, a chip-on-board (COB) type of LED package structure. Moreover, phosphor 152 of fluorescent encapsulant 150 is distributed on a surface of each of the LED chips 120a. Of course, as shown in FIG. 2A, fluorescent encapsulant 150 is filled in the groove U that is defined on carrier 110, and phosphor 152 is distributed in the groove U and over or on an upper surface of the second annular 140a.

As the LED chips 120a are electrically coupled to carrier 110 by flip chip bonding, wire bonding spaces between adjacent LED chips 120a can be saved and more LED chips 120a can be carried per unit area of carrier 110. With a greater number of LED chips, the intensity of light of the LED package structure 100d can be effectively increased. Additionally, given that LED packages structure 100d is designed with the first annular wall 130a and the second annular wall 140a, phosphor 152 of fluorescent encapsulant 150 is distributed over the surface of each of the LED chips 120a and in gaps between the LED chips 120a, as well as over an upper surface of the second annular wall 140a and in the gap between the first annular wall 130a and the second annular wall 140a. Therefore, as no excessive amount of phosphor 152 is accumulated around LED chips 120a (i.e., the peripheral region 114 of carrier 110), unused space in the peripheral region 114 of carrier 110 can be reduced. Given the characteristics of non-absorption of light and reflectiveness of the first annular wall 130a and the second annular wall 140a, the phosphor 152 accumulated on the upper surface of the second annular wall 140a as well as in the gap between the first annular wall 130a and the second annular wall 140a is less likely to be excited by light emitted from LED chips 120a. Accordingly, the phenomenon of yellow halo produced around peripheral region 114 can be effectively avoided or otherwise minimized.

Moreover, given the characteristics of non-absorption of light and reflectiveness of the first annular wall 130a and the second annular wall 140a, the intensity of light of LED package structure 100d can be effectively increased by reflecting and scattering the color light emitted by the LED chips 120a to within the carrying region 112. Simply put, LED package structure 100d of the present embodiment can produce better optical effects.

Figure 2C:
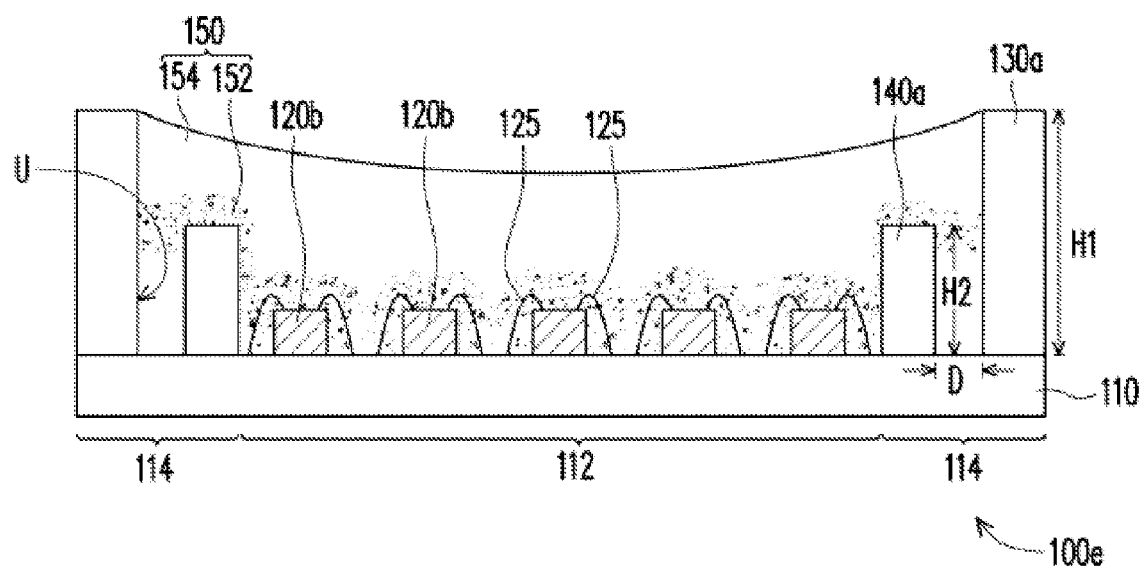
FIG. 2C is cross-sectional view of a LED package structure in accordance with still another embodiment of the present disclosure.

Notably, how LED chips 120a and carrier 110 are coupled together is not limited to any given way even though LED chips 120a are electrically coupled to carrier 10 by flip chip bonding in the illustrated embodiment. In other embodiments, referring to FIG. 2C, LED chips 120b of LED package structure 100e are electrically coupled to carrier 110 by wire bonding using multiple electrically conductive wires 125, and such is a feasible technical solution within the protective scope of the present disclosure.

Moreover, although carrier 110, the first annular wall 130a and the second annular wall 140a of the illustrated embodiment are individual components, carrier 110 and the first annular wall 130a may be integral parts of a monolithic structure in other, non-illustrated embodiments. The materials of carrier 110 and the material of the first annular wall 130a may be, for example, metal. Alternatively, carrier 110 and the second annular wall 140a may be integral parts of a monolithic structure. The materials of carrier 110 and the material of the second annular wall 140a may be, for example, metal.

In the illustrated embodiment of FIG. 2B, the second annular wall 140a and the first annular wall 130a have similar form in that they are continuous walls. In other embodiments, the second annular wall 140b is a discontinuous wall (referring to FIG. 1D as an example). Under the same concept, the first annular wall 130a may also be a discontinuous wall (not shown). Such variations are feasible technical solutions with the protective scope of the present disclosure.

Embodiments of the structures, but not the manufacturing method, of LED package structures 100a, 100b, 100c, 100d and 100e are described above. Accordingly, embodiments of the manufacturing method of LED package structures 100a, 100b, 100c, 100d and 100e are described below.

Figure 3:
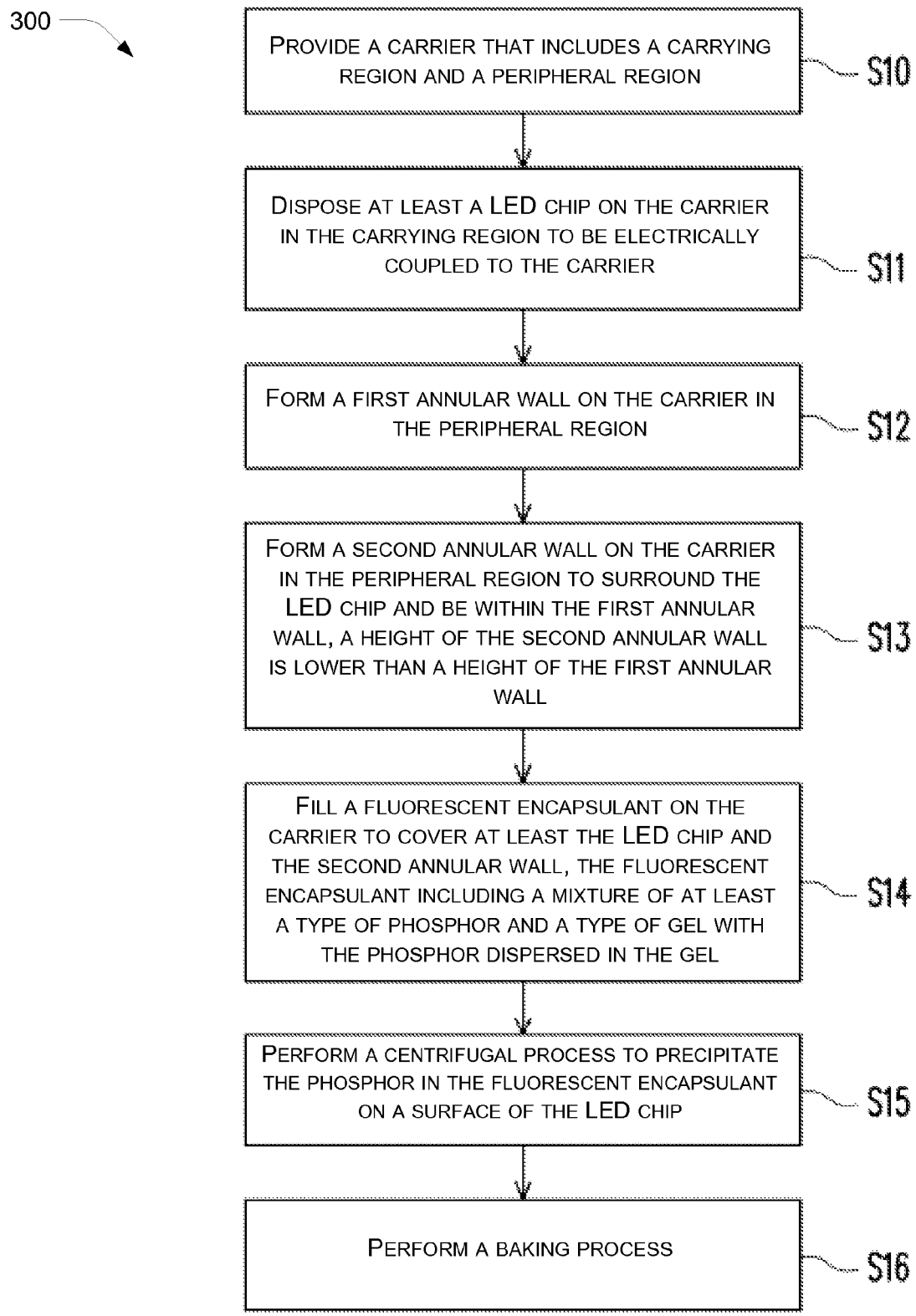
FIG. 3 is a flowchart of a process of manufacturing of a LED package structure in accordance with an embodiment of the present disclosure.

FIG. 3 illustrates a flowchart of a process 300 of manufacturing of a LED package structure in accordance with an embodiment of the present disclosure. The following description of FIG. 3 refers to FIGS. 1A-1D and FIGS. 2A-2C.

According to process 300 of manufacturing of a LED package structure of the present disclosure, at step S10, a carrier 110 is provided. The carrier 110 includes a carrying region 112 and a peripheral region 114 that surrounds the carrying region 112. The material of carrier 110 may be, for example, ceramic, polymer, silicon, silicon carbide, electrically insulating material or metal. When the material of carrier 110 includes metal, carrier 110 may be a copper substrate or a metal core printed circuit board (MCPCB) but is not limited thereto.

Then, at step S11, at least a LED chip 120a (or 120b) is disposed on carrier 110 in the carrying region 112 and electrically coupled to carrier 110. The LED chip 120a (or 120b) is electrically coupled to carrier 110 by flip chip bonding (or wire bonding).

Next, at step S12, a first annular wall 130a is formed on carrier 110 in the peripheral region 114.

Then, at step S13, a second annular wall 140a (or 140b) is formed on carrier 110 in the peripheral region 114. Particularly, the second annular wall 140a (or 140b) surrounds the LED chip 140a (or 140b) and is surrounded by the first annular wall 130a, between the LED chip 120a (or 120b) and the first annular wall 130a. A height H2 of the second annular wall 140a (or 140b) is lower than a height H1 of the first annular wall 130a. More specifically, a gap D exists between the second annular wall 140a (or 140b) and the first annular wall 130a and defines a groove U on carrier 110. The materials of the first annular wall 130a and the second annular wall 140a (or 140b) have the characteristics of non-absorption of light and reflectiveness, and may be, for example, silicon, silicon oxide, boron nitride, rubber, an organic polymer material, or metal. The material of the first annular wall 130a and that of the second annular wall 140a (or 140b) may be substantially the same or different, and are not limited thereto. In one embodiment, each of the first annular wall 130a and the second annular wall 140a (or 140b) is a continuous wall and may alternatively be varied to be a discontinuous wall.

It is noteworthy that the order in which the first annular wall 130a and the second annular wall 140a (or 140b) are formed is not limited to a given order. That is, the first annular wall 130a may be formed first followed by the formation of the second annular wall 140a (or 140b). Alternatively, the first annular wall 130a and carrier 110 may be formed monolithically first and then the second annular wall 140a (or 140b) is formed on carrier 110. Or, the second annular wall 140a (or 140b) is formed first followed by the formation of the first annular wall 130a. Additionally, the formation of the first annular wall 130a and the second annular wall 140a (or 140b) may be through a dispensing process (in this case, the material of the first annular wall 130a and the second annular wall 140a (or 140b) is rubber for example) by a dispenser (not shown) or through lithography, etching and electroplating processes (in such case, the material of the first annular wall 130*a* and the second annular wall 140*a* (or 140*b*) is metal for example).

Afterwards, at step S14, a fluorescent encapsulant 150 is filled on carrier 110 to cover at least the LED chip 120*a* (or 120*b*) and the second annular wall 140*a* (or 140*b*). The fluorescent encapsulant 150 includes a mixture of at least a type of phosphor 152 and a type of gel 154, with phosphor 152 dispersed within gel 154. Notably, fluorescent encapsulant 150 may be filled through a dispensing process by a dispenser (not shown). To avoid different speeds of precipitation of phosphor 152 in the fluorescent encapsulant 150 during the dispensing process, an anti-precipitation agent (not shown) such as silicon oxide ($SiO_2$) is typically added in the fluorescent encapsulant 150. Further, a light scattering agent (not shown) may be added in fluorescent encapsulant 150 to adjust optical effects such as color or uniformity of the light emitted by LED package structure 100*a* (or 100*b*, 100*c*, 100*d* or 100*e*).

Next, at step S15, a centrifugal process is performed to precipitate phosphor 152 in fluorescent encapsulant 150 on a surface of LED chip 120*a* (or 120*b*). In one embodiment, the centrifugal process is performed by a centrifuge (not shown) to distribute phosphor 152, which is dispersed in gel 154, evenly onto the surface of LED chip 120*a* (or 120*b*) by centrifugal force. This avoids negative impact on optical effects due to uneven thickness of accumulated phosphor 152, and also avoids sidewall yellow halo due to excessive amount of phosphor 152 being accumulated in the peripheral region 114 of carrier 110. Of course, during the centrifugal process, phosphor 152 may be filled into the groove U of carrier 110 due to the centrifugal force.

Lastly, at step S16, an oven is used to carry out a baking process to cure fluorescent encapsulant 150 to complete the manufacturing of LED package structure 100*a*, 100*b*, 100*c*, 100*d* or 100*e*.

Given that the centrifugal process is performed to distribute phosphor 152 in fluorescent encapsulant 150 onto the surface of LED chip 120*a* (or 120*b*) before the baking process, chromaticity coordinates of LED package structure 100*a*, 100*b*, 100*c*, 100*d* or 100*e* tend not to be easily shifted/offset or increased (elongated) and can be more focused to yield better chromatic performance compared to the conventional approach of baking after fluorescent encapsulant is filled. Additionally, as the centrifugal process rids of air bubbles from the fluorescent encapsulant 150, LED package structure 100*a*, 100*b*, 100*c*, 100*d* or 100*e* can produce better optical effects.

Figure 4A:
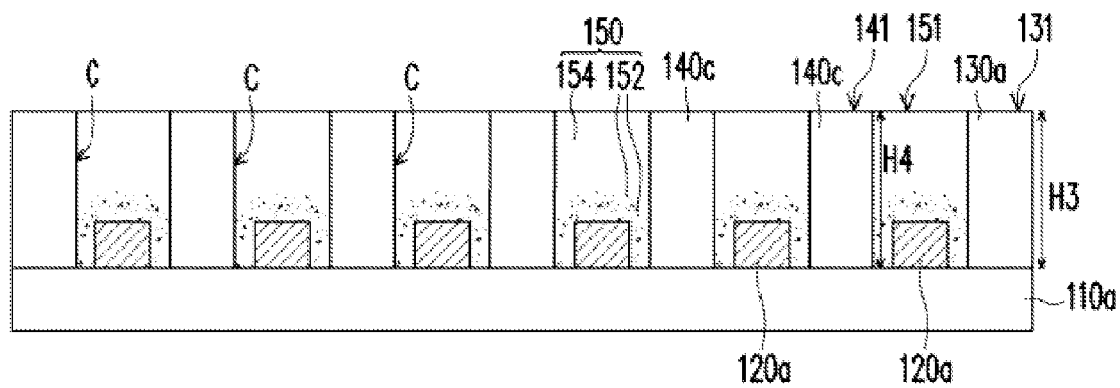
FIG. 4A is a cross-sectional view of a LED package structure in accordance with an embodiment of the present disclosure.
Figure 4B:
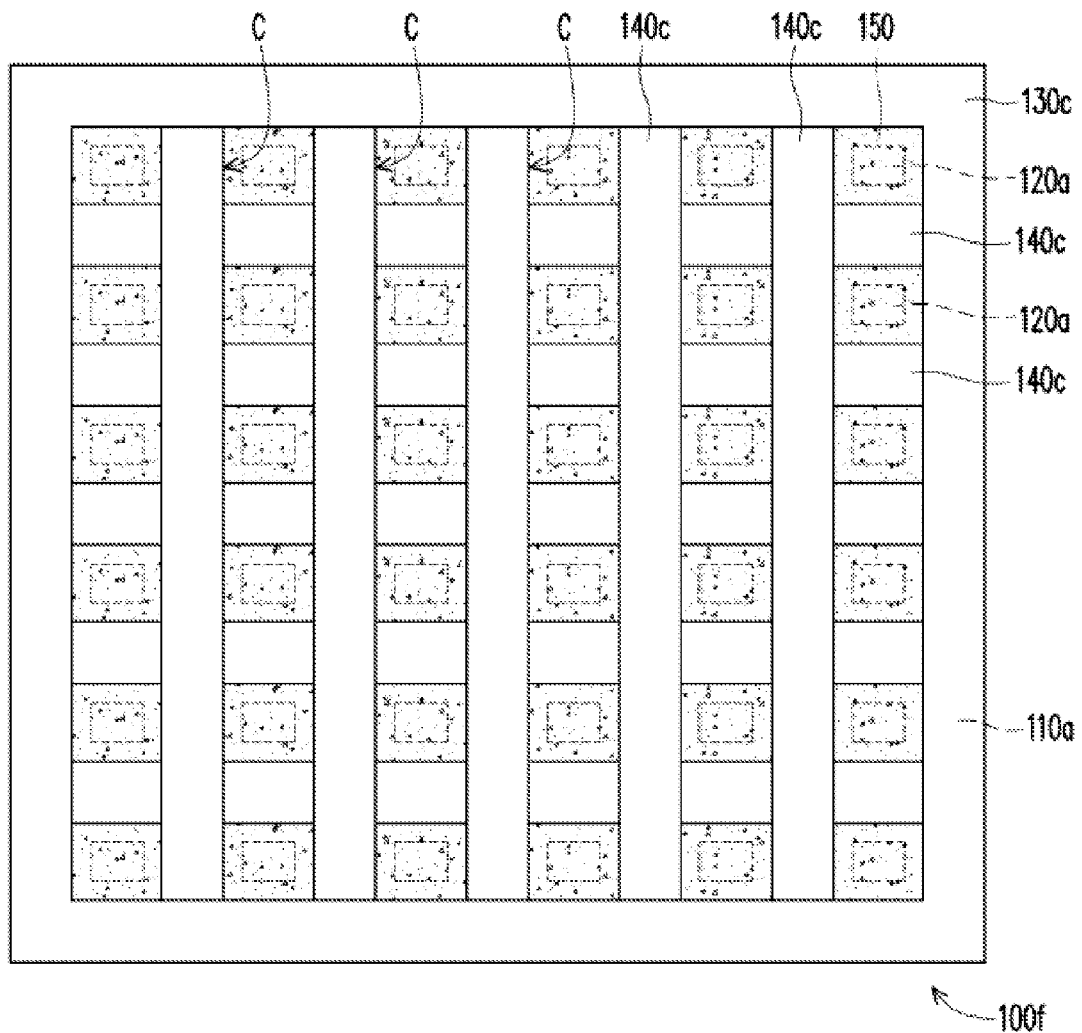
FIG. 4B is a top view of the LED package structure of FIG. 4A.

FIG. 4A illustrates a cross-sectional view of a LED package structure in accordance with another embodiment of the present disclosure. FIG. 4B illustrates a top view of the LED package structure of FIG. 4A. For certain components thereof that are similar or identical to those described above, the same numeral references are used. In the interest of brevity, detailed description of such components is not repeated.

Referring to FIGS. 4A and 4B, in the illustrated embodiment, a LED package structure 100*f* includes a carrier 110*a*, multiple LED chips 120*a*, an annular wall 130*c*, multiple strip walls 140*c* and a fluorescent encapsulant 150. The material of carrier 110*a* may be, for example, ceramic, polymer or metal. When the material of carrier 110 includes metal, carrier 110 may be a copper substrate or a metal core printed circuit board (MCPCB) but is not limited thereto. In the illustrated embodiment, LED chips 120*a* are disposed on and electrically coupled to carrier 110*a*. The LED chips 120*a* are electrically coupled to carrier 110*a* by flip chip bonding. The annular wall 130*c* is disposed on carrier 110*a* and surrounds the LED chips 120*a*.

Figure 4C:
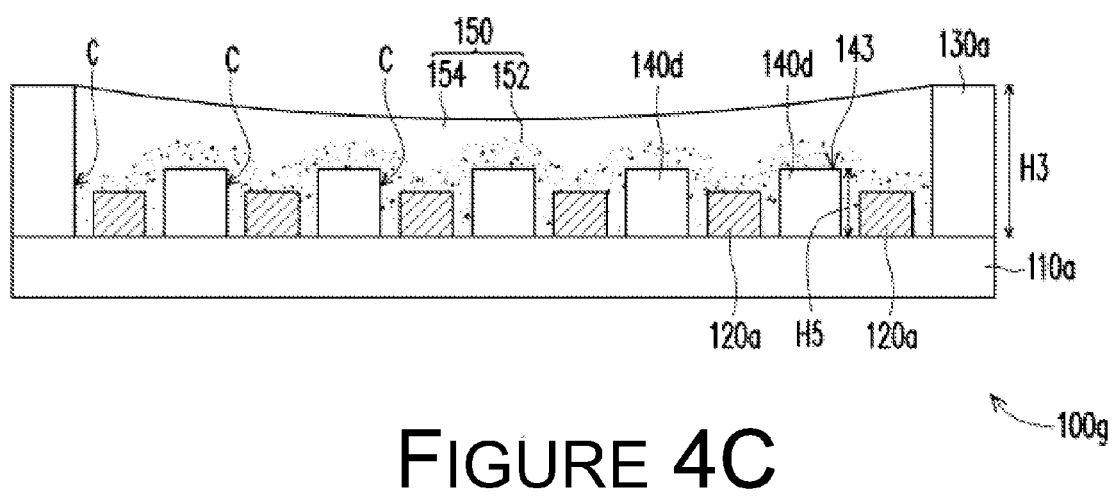
FIG. 4C is a cross-sectional view of a LED package structure in accordance with another embodiment of the present disclosure.
Figure 4D:
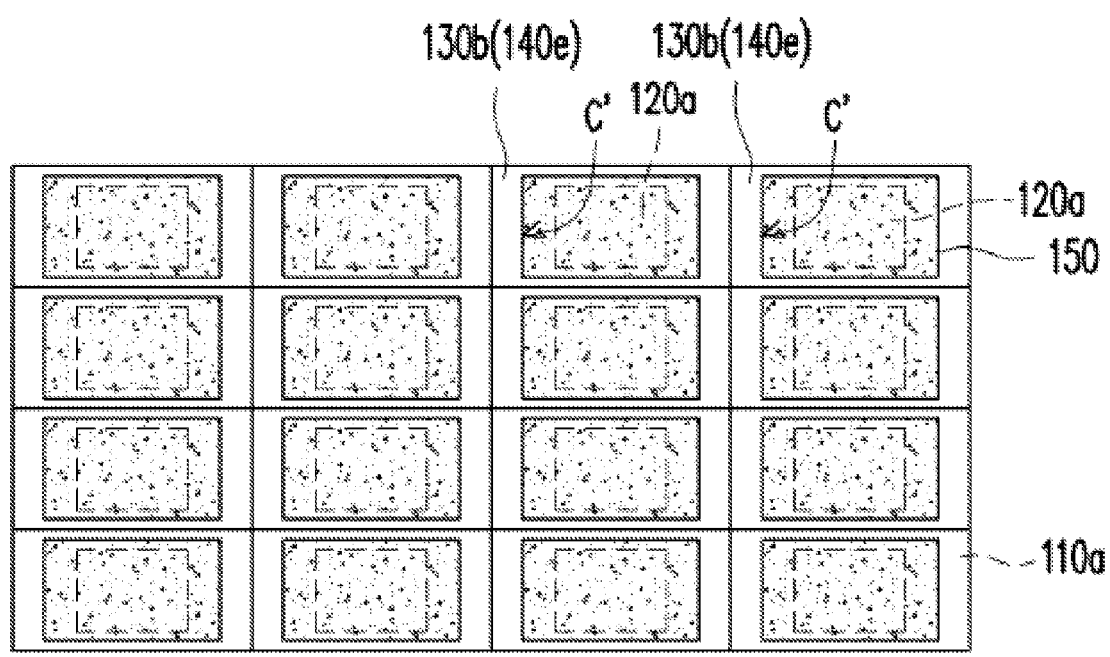
FIG. 4D is a top view of the LED package structure in accordance with another embodiment of the present disclosure.

The strip walls 140*c* are disposed on carrier 110*a* and connected to the annular wall 130*c*. Strip walls 140*c* and annular wall 130*c* define multiple lattice-shaped grooves C on carrier 110*a*, and LED chips 120*a* are disposed in the lattice-shaped grooves C. In another embodiment, referring to FIG. 4D, strip walls 140*e* of LED package structure 100*h* abut one another to define multiple sub-annular walls 130*b*. Sub-annular walls 130*b* are disposed on carrier 110*a* and surround the LED chips 120*a* individually to define multiple lattice-shaped grooves C'. Referring again to FIGS. 4A and 4B, fluorescent encapsulant 150 is disposed on carrier 110*a* and filled in lattice-shaped grooves C to cover at least the LED chips 120*a*. Fluorescent encapsulant 150 includes at least a type of phosphor 152 and a type of gel 154. Phosphor 152 is distributed over or on a surface of each of the LED chips 120*a*. More specifically, in the illustrated embodiment, a height H3 of annular wall 130*a* is substantially the same as a height H4 of each of the strip walls 140*c*. Strip walls 140*c* comprise of multiple continuous walls (such as walls in the vertical direction in FIG. 4B) and multiple discontinuous walls (such as walls in the horizontal direction in FIG. 4B), but are not limited thereto. The material of annular wall 130*c* and the material of each of strip walls 140*c* may be, for example, silicon, silicon oxide, boron nitride, rubber, an organic polymer material, or metal.

As the LED chips 120*a* of the present embodiment are electrically coupled to carrier 110*a* by flip chip bonding, wire bonding spaces between adjacent LED chips 120*a* can be saved and more LED chips 120*a* can be carried per unit area of carrier 110*a*. With a greater number of LED chips, the intensity of light of the LED package structure 100*h* can be effectively increased. Additionally, given that LED packages structure 100*f* is designed with the annular wall 130*c* and the strip walls 140*c*, unused space on carrier 110*a* can be reduced. This minimizes the amount of phosphor 152 accumulated in the gaps between annular wall 130*c* and strip walls 140*c*, and thus minimizes the excitation thereof by the light emitted by LED chips 120*a* to thereby effectively avoid the phenomenon of sidewall yellow halo. Moreover, as annular wall 130*c* and strip walls 140*c* have the characteristics of non-absorption of light and reflectiveness, light emitted by LED chips 120*a* can be reflected and scattered to produce color light to effectively increase the intensity of light of LED packages structure 100*h*. Simply put, LED package structure 100*h* of the present embodiment can produce better optical effects.

It is noteworthy that how LED chips 120*a* and carrier 110 are coupled together is not limited to any given way even though LED chips 120*a* are electrically coupled to carrier 10 by flip chip bonding in the illustrated embodiment. In other, non-illustrated embodiments, LED chips of a LED package structure may be electrically coupled to the carrier by wire bonding using multiple electrically conductive wires, and such is a feasible technical solution within the protective scope of the present disclosure. Moreover, although carrier 110*a*, annular wall 130*c* and strip walls 140*c* of the illustrated embodiment are individual components, carrier 110 and the annular wall 130*c* may be integral parts of a monolithic structure in other, non-illustrated embodiments. The materials of carrier 110 and the material of the annular wall 130*c* may be, for example, metal. Alternatively, carrier 110 and strip walls 140*c* may be integral parts of a monolithic structure. The materials of carrier 110 and the material of strip walls 140*c* may be, for example, metal. Furthermore, although the height H4 of strip walls 140*c* and the height H3 of annular wall 130*c* are substantially the same, in other embodiments, referring to FIG. 4C, a height H5 of each of the strip walls 140c of LED package structure 100g is lower than the height H3 of annular wall 130c. This is a feasible technical solution within the protective scope of the present disclosure. Additionally, in other embodiments, those ordinarily skilled in the art may, depending on actual implementations, selectively use above-described components, materials for the components, forms of the components and arrangement to achieve the desired technical effect(s).

Embodiments of the structures, but not the manufacturing method, of LED package structures 100f, 100g and 100h are described above. Accordingly, embodiments of the manufacturing method of LED package structures 100f, 100g and 100h are described below.

Figure 5:
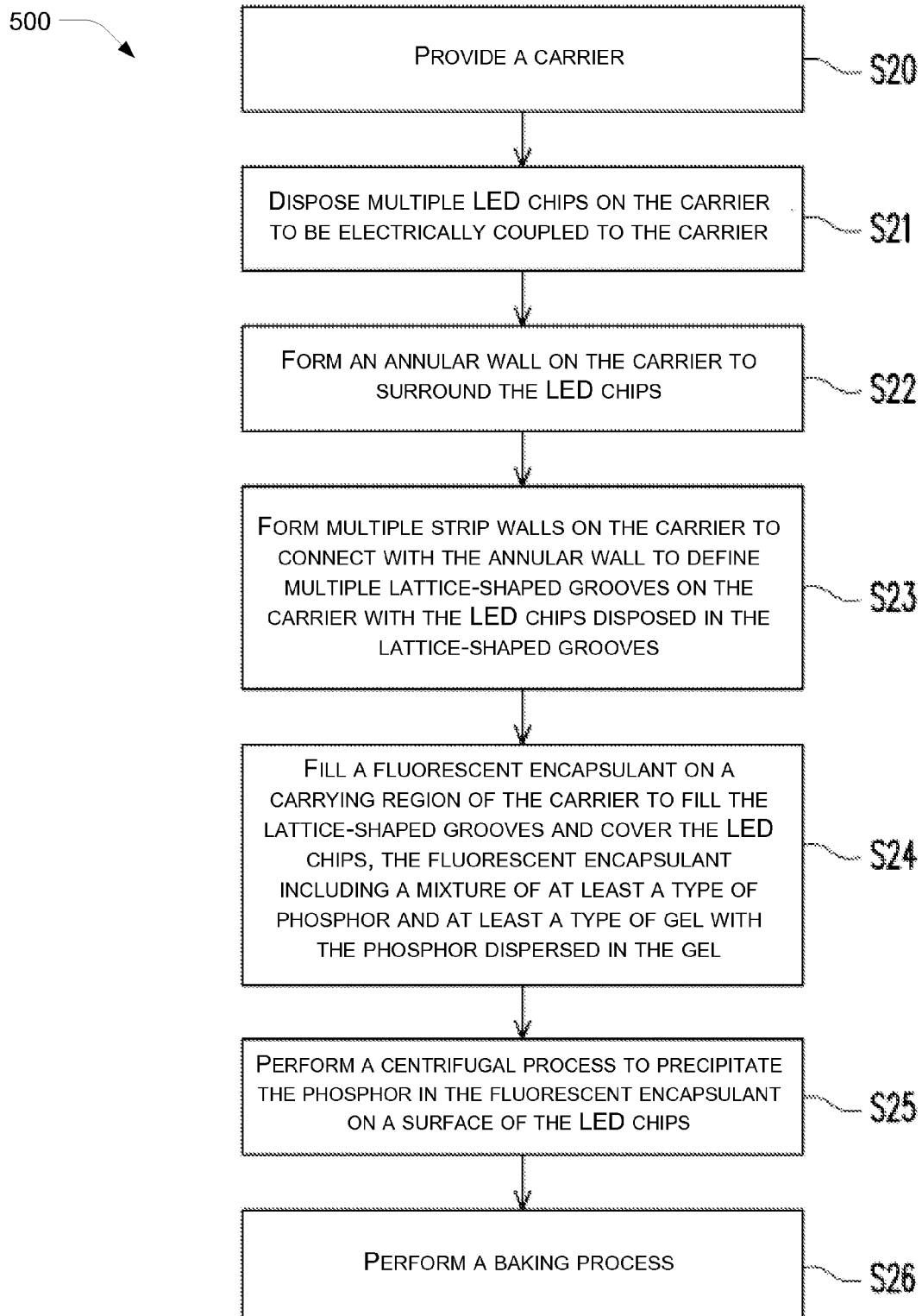
FIG. 5 is a flowchart of a process of manufacturing of a LED package structure in accordance with another embodiment of the present disclosure.

FIG. 5 illustrates a flowchart of a process 500 of manufacturing of a LED package structure in accordance with another embodiment of the present disclosure. The following description of FIG. 5 refers to FIGS. 4A-4C. According to process 500 of manufacturing of a LED package structure of the present disclosure, at step S20, a carrier 110a is provided. The material of carrier 110a may be, for example, ceramic, polymer, or metal. When the material of carrier 110a includes metal, carrier 110a may be a copper substrate or a metal core printed circuit board (MCPCB) but is not limited thereto.

Then, at step S21, multiple LED chips 120a are disposed on carrier 110a and electrically coupled to carrier 110. The LED chips 120a are electrically coupled to carrier 110a by flip chip bonding. Of course, in other, non-illustrated embodiments, LED chips may be electrically coupled to carrier by wire bonding.

Next, at step S22, an annular wall 130c is formed on carrier 110a to surround LED chips 120a.

Then, at step S23, multiple strip walls 140c (or 140d) are formed on carrier 110a. Strip walls 140c (or 140d) are connected to annular wall 130c and together define multiple lattice-shaped grooves C on carrier 110a, with LED chips 120a disposed in the lattice-shaped grooves C. In one embodiment, a height H4 (or H5) of strip walls 140c (or 140d) is substantially the same as (or lower than) a height H3 of annular wall 130c. The materials of annular wall 130c and strip walls 140c (or 140d) have the characteristics of non-absorption of light and reflectiveness, and may be, for example, silicon, silicon oxide, boron nitride, rubber, an organic polymer material, or metal. In the present embodiment, the materials of annular wall 130c and strip walls 140c (or 140d) may be substantially the same or different, and are not limited thereto. In one embodiment, annular wall 130c is a continuous wall, and strip walls 140c (or 140d) may include a combination of continuous walls and discontinuous walls.

Notably, the order in which annular wall 130c and strip walls 140c (or 140d) are formed is not limited to a given order. That is, annular wall 130c may be formed first followed by the formation of strip walls 140c (or 140d). Alternatively, annular wall 130c and carrier 110a may be formed monolithically first and then strip walls 140c (or 140d) are formed on carrier 110a. Or, strip walls 140c (or 140d) and carrier 110a may be formed monolithically first and then annular wall 130c is formed on carrier 110a. Additionally, the formation of annular wall 130c and strip walls 140c (or 140d) may be through a dispensing process (in this case, the material of annular wall 130c and strip walls 140c (or 140d) is rubber for example) by a dispenser (not shown) or through lithography, etching and electroplating processes (in such case, the material of annular wall 130c and strip walls 140c (or 140d) is metal for example).

Afterwards, at step S24, a fluorescent encapsulant 150 is filled on a carrying region of carrier 110a (where LED chips 120a are disposed). The fluorescent encapsulant 150 is filled in lattice-shaped grooves C and at least covers LED chips 120a. Fluorescent encapsulant 150 includes a mixture of at least a type of phosphor 152 and a type of gel 154, with phosphor 152 dispersed within gel 154. Notably, fluorescent encapsulant 150 may be filled through a dispensing process by a dispenser (not shown). To avoid different speeds of precipitation of phosphor 152 in the fluorescent encapsulant 150 during the dispensing process, an anti-precipitation agent (not shown) such as silicon oxide ($SiO_2$) is typically added in the fluorescent encapsulant 150. Further, a light scattering agent (not shown) may be added in fluorescent encapsulant 150 to adjust optical effects such as color or uniformity of the light emitted by LED package structure 100f (or 100g or 100h).

More specifically, in the present embodiment, when the height H4 of strip walls 140c is substantially the same as the height H3 of annular wall 130c, the process of filling fluorescent encapsulant 150 in the lattice-shaped grooves C is as follows: fluorescent encapsulant 150 is sequentially filled in lattice-shaped grooves C such that, referring to FIG. 4A, the heights of an upper surface 151 of fluorescent encapsulant 150, an upper surface 131 of annular wall 130c, and an upper surface 141 of strip walls 140a are substantially the same. In another embodiment, when the height H5 of strip walls 140d is lower than the height H3 of annular wall 130c, the process of filling fluorescent encapsulant 150 in the lattice-shaped grooves C is as follows: fluorescent encapsulant 150 is filled in some of the lattice-shaped grooves C followed by a centrifugal process described below with respect to step S23. This allows fluorescent encapsulant 150 to flow toward the sides to fully fill lattice-shaped grooves C, and fluorescent encapsulant 150 covers an upper surface 143 of each of the strip walls 140d. Please see FIG. 4C for reference.

Next, at step S25, a centrifugal process is performed to precipitate phosphor 152 in fluorescent encapsulant 150 on a surface of LED chips 120a. In one embodiment, the centrifugal process is performed by a centrifuge (not shown) to precipitate phosphor 152, which is dispersed in gel 154, onto the surface of LED chips 120a by centrifugal force. This avoids sidewall yellow halo due to excessive amount of phosphor 152 being accumulated unused space on carrier 110a.

Lastly, at step S26, an oven is used to carry out a baking process to cure fluorescent encapsulant 150 to complete the manufacturing of LED package structure 100f, 100g or 100h.

Given that the centrifugal process is performed to distribute phosphor 152 in fluorescent encapsulant 150 onto the surface of LED chip 120a before the baking process, chromaticity coordinates of LED package structure 100f, 100g or 100h tend not to be easily shifted/offset or increased (elongated) and can be more focused to yield better chromatic performance compared to the conventional approach of baking after fluorescent encapsulant is filled. Moreover, when the heights of annular wall 130c and strip walls 140c are substantially the same, a phenomenon of recessed encapsulant can be avoided during the centrifugal process. Additionally, as the centrifugal process rids of air bubbles from the fluorescent encapsulant 150, LED package structure 100f, 100g or 100h can produce better optical effects.

In view of the above, one or more LED chips of the present disclosure can be electrically coupled to a carrier by flip chip bonding, and relatively more LED chips can be carried per unit area of the carrier. With higher number of LED chips, the intensity of light emitted by the LED package structure can be increased effectively. Additionally, a LED package structure of the present disclosure is designed with a combination of a first annular wall and a second annular wall, or a combination of annular wall and strip walls, with phosphor of a fluorescent encapsulant distributed over a surface of the LED chip(s). Thus, no excessive amount of phosphor will accumulate around the LED chip(s) and unused space can be minimized to allow more phosphor to be distributed over the surface of the LED chip(s), thereby effectively avoiding the phenomenon of sidewall yellow halo. Moreover, as the first annular wall, the second annular wall, the annular wall and strip walls have the characteristics of non-absorption of light and reflectiveness, color light produced by the LED chip(s) can be reflected and scattered to effectively increase the intensity of light emitted by the LED packages structure. Simply put, LED package structures of the present disclosure can produce better optical effects.

Furthermore, according to the present disclosure a centrifugal process is performed to distribute the phosphor in fluorescent encapsulant onto the surface of the LED chip(s), the phosphor can be evenly distributed over the surface of the LED chip(s) to avoid negative impact on optical effects due to uneven thickness of accumulated phosphor or the phenomenon of sidewall yellow halo due to excessive accumulation of phosphor in unused space. Moreover, as the centrifugal process is performed to distribute the phosphor in fluorescent encapsulant onto the surface of the LED chip(s) before a baking process is performed, chromaticity coordinates of a LED package structure of the present disclosure tend not to be easily shifted/offset or increased (elongated) and can be more focused to yield better chromatic performance compared to the conventional approach of baking after fluorescent encapsulant is filled. Additionally, when the heights of annular wall and strip walls are substantially the same, a phenomenon of recessed encapsulant can be avoided during the centrifugal process. Moreover, as the centrifugal process rids of air bubbles from the fluorescent encapsulant, the LED package structure can produce better optical effects.

It is noteworthy that, in the above-described embodiments, the walls may be in a closed annular form or a non-closed annular form. The closed annular form may be, for example, quadrilateral, round, oval/elliptical, egg-shaped, star-shaped or otherwise polygonal. The non-closed annular form may be, for example, arc-shaped, linear or randomly variably curved. More specifically, the shape of the walls may correspond to the contour/profile of the LED chip(s). That is, the shape of the walls are conformal to the contour/profile of the LED chip(s).

In the above-described embodiments, the first annular wall is a continuous annular wall, and a height thereof may be a constant or varying height.

In the above-described embodiments, the second annular wall is a continuous annular wall, and a height thereof may be a constant or varying height.

In the above-described embodiments, the first annular wall may be a discontinuous annular wall, and a height thereof may be a constant or varying height. In the above-described embodiments, the second annular wall may be a discontinuous annular wall, and a height thereof may be a constant or varying height.

In the above-described embodiments, the first annular wall may be made of a reflective material or, alternatively, made of a non-reflective material and coated with a reflective material.

In the above-described embodiments, the second annular wall may be made of a reflective material or, alternatively, made of a non-reflective material and coated with a reflective material.

In the above-described embodiments, a distribution of the density of the phosphor may vary depending on the height of the LED chip(s), the height of the first annular wall, the height of the second annular wall, a gap between the LED chip(s) and the first annular wall, and a gap between the first annular wall and the second annular wall.

In the above-described embodiments, the density of the phosphor gradually increases or decreases in a direction moving from a surface of the fluorescent encapsulant to a surface of the LED chip(s).

In the above-described embodiments, the density of the phosphor gradually increases or decreases in a direction moving from a surface of the LED chip(s) to a side of the LED chip(s).

In the above-described embodiments, when the density of the phosphor gradually increases or decreases in a direction moving from a surface of the fluorescent encapsulant to a surface of the LED chip(s), the density of the phosphor gradually increases or decreases in a direction moving from the surface of the LED chip(s) to the side of the LED chip(s).

Although various embodiments of the present disclosure are described above, they do not limit the inventive concept of the present disclosure. One of ordinary skill in the art can make changes and modifications therefrom without departing from the spirit and scope of the present disclosure. Thus, the protective scope of the present disclosure is defined by the claims provided below.

What is claimed is:

1. A light emitting diode (LED) package structure, comprising:
   a carrier that comprises a carrying region and a peripheral region surrounding the carrying region;
   at least one LED chip disposed on the carrier in the carrying region and electrically coupled to the carrier;
   a first annular wall disposed on the carrier in the peripheral region and surrounding the at least one LED chip;
   a second annular wall disposed within the first annular wall and surrounding the at least one LED chip, a height of the second annular wall is lower than a height of the first annular wall, the second annular wall and the first annular wall defining a groove therebetween; and
   a fluorescent encapsulant disposed on the carrier and covering at least the at least one LED chip and the second annular wall, the fluorescent encapsulant comprising at least a phosphor and a gel with the phosphor distributed over a surface of the at least one LED chip, the phosphor also distributed over or on an upper surface of the second annular wall,
   wherein at least one of the first annular wall and the second annular wall has characteristics of non-absorption of light and reflectiveness.

2. The LED package structure of claim 1, wherein a gap between the first annular wall and the second annular wall defines a groove, and wherein the fluorescent encapsulant is filled in the groove.

3. The LED package structure of claim 1, wherein the carrier and at least the first annular wall or the second annular wall are integral parts of a monolithic structure.

4. The LED package structure of claim 1, wherein the first annular wall or the second annular wall comprises a plurality of discontinuous walls.

5. The LED package structure of claim 1, further comprising:
   a plurality of strip walls disposed on the carrier and connected to the second annular wall, the strip walls and the second annular wall defining a plurality of lattice-shaped grooves, the at least one LED chip disposed in the lattice-shaped grooves.

6. The LED package structure of claim 1, wherein a material of the first annular wall and a material of the second annular wall comprise silicon, silicon oxide, boron nitride, rubber, organic polymer, or metal.

* * * * *